(12) United States Patent
Wang et al.

(10) Patent No.: US 8,716,730 B2
(45) Date of Patent: May 6, 2014

(54) LED MODULE HAVING A PLATFORM WITH A CENTRAL RECESSION

(75) Inventors: Yanqi Wang, Kassel (DE); Hiroaki Kawaguchi, Aichi (JP); Friedrich Wagner, Fehring (AT)

(73) Assignee: Ledon Lighting Jennersdorf GmbH, Jennersdorf (AT)

( * ) Notice: Subject to any disclaimer, the term of this patent is extended or adjusted under 35 U.S.C. 154(b) by 157 days.

(21) Appl. No.: 12/935,559

(22) PCT Filed: Apr. 1, 2009
(Under 37 CFR 1.47)

(86) PCT No.: PCT/EP2009/002388
§ 371 (c)(1),
(2), (4) Date: May 25, 2011

(87) PCT Pub. No.: WO2009/127326
PCT Pub. Date: Oct. 22, 2009

(65) Prior Publication Data
US 2011/0309396 A1    Dec. 22, 2011

(30) Foreign Application Priority Data

Apr. 18, 2008    (DE) .......................... 10 2008 019 667

(51) Int. Cl.
*H01L 33/60*    (2010.01)
(52) U.S. Cl.
USPC ............... 257/98; 257/100; 257/79; 257/690; 257/692; 257/701; 257/773; 362/260; 362/293; 362/84; 362/800
(58) Field of Classification Search
USPC ........ 362/260, 293, 800, 84; 257/98, 100, 79, 257/690, 692, 701, 773
See application file for complete search history.

(56) References Cited

U.S. PATENT DOCUMENTS

| 6,066,861 | A | 5/2000 | Hohn et al. |
| 2003/0189236 | A1 | 10/2003 | Arndt |

(Continued)

FOREIGN PATENT DOCUMENTS

| EP | 1441395 A2 | 7/2004 |
| EP | 1848044 A2 | 10/2007 |
| JP | 07202271 A | 8/1995 |

OTHER PUBLICATIONS

International Prelimina Resort on Patentability for PCT/EP2009/002388 dated Jul. 2, 2010.

(Continued)

*Primary Examiner* — Michael Shingleton
(74) *Attorney, Agent, or Firm* — Marshall, Gerstein & Borun LLP (57) ABSTRACT

An LED module comprises a platform having a recession, wherein the recession presents a center section with a bottom and an enlarged section surrounding the center portion. An LED chip is arranged on the bottom of the center section. A bond wire leads from the LED chip to the bottom of the enlarged section in order to contact a first electrode of the LED chip. In one embodiment the bond wire is electrically connected to the back side of the platform by means of a through contact leading from the bottom of the enlarged section through the platform to the backside of the platform. In another embodiment a first conducting path leads from a first electrode of the LED chip across the side wall of the recession to the surface of the platform and from there across a lateral wall of the platform to the back side of the platform. A second conducting path, electrically isolated from the first conducting path, leads from a second electrode of the LED chip across the side wall of the recession to the to surface of the platform and from there across a lateral wall of the platform to the back side of the platform.

24 Claims, 6 Drawing Sheets

(56) References Cited

U.S. PATENT DOCUMENTS

| | | |
|---|---|---|
| 2005/0221518 A1 | 10/2005 | Andrews et al. |
| 2005/0231953 A1* | 10/2005 | Reeh et al. ............... 362/260 |
| 2006/0138436 A1 | 6/2006 | Chen et al. |
| 2006/0193121 A1* | 8/2006 | Kamoshita ............... 362/84 |
| 2007/0099325 A1 | 5/2007 | Park |
| 2007/0221928 A1* | 9/2007 | Lee et al. ............... 257/79 |

OTHER PUBLICATIONS

International Search Report for PCT/EP2009/002388 dated Feb. 26, 2010.

* cited by examiner

LED MODULE HAVING A PLATFORM WITH A CENTRAL RECESSION

BACKGROUND OF THE INVENTION

1. Field of the Invention

The present invention relates to the field of solid-state lighting.

2. Related Technology

The invention particularly relates to the field of LED modules having a platform on which at least one LED chip (LED die) is mounted. The LED chip especially can be a monochromatic LED chip, such as for example a blue light emitting LED chip. As it is well known, in case a layer comprising color conversion particles is placed on top of this chip, the color conversion particles will convert (usually down-convert) at least a portion of the light emitted from the LED chip such that a mixture of the spectrum originally emitted by the LED chip and the spectrum produced by the conversion of the color conversion particles will be emitted from the LED module. Via this technique e.g. a white light emitting LED module can be produced.

In the recent past surface mounting technology (SMT) has been developed for LED packaging design. The SMT approach has the advantage of minimizing the LED component size.

In order to mount a vertical type LED chip and a Face Up (FU) horizontal type LED chip on the package (e.g. made from silicon) usually a metal pad in an etched recess of the platform is produced in order to mount the LED chip. Additionally, at least one wire bond (normally made from gold) is used to connect the top face electrode of the LED chip with the electrical path usually leading to the backside of the platform.

The electrical connection between the front side of the wafer, at which the LED chip (S) is mounted and the backside of the wafer, where usually the power supply and the control circuitry is located, are realized by surface metallization as an electrical circuitry.

Generally, the minimization of the component size of the LED package is an important issue for modern LED applications, such as for example in mobile phones, portable displays, backlights for LCDs, etc. Also the optics, e.g. in case of using lenses, demands a minimization of the light source itself.

SUMMARY OF THE INVENTION

The present invention therefore provides a technology for especially minimizing an LED module having a chip in a recess of a platform.

Accordingly, the invention provides an LED module, comprising a platform having a recession, the recession having a center section with a bottom and a step-wise enlarged section surrounding the center section, at least one LED chip arranged on the bottom of the central section, and a bond wire leading from the LED chip to the bottom of the enlarged section to contact a first electrode of the LED chip, wherein the bond wire is electrically connected to the back side of the platform by a through contact leading from the bottom of the enlarged section through the platform to the backside of the platform.

According to a first aspect of the invention a LED module is proposed having at least one through hole in the platform and comprising:

a platform having a recession, the recession having a center section with a bottom and a step-wise enlarged section surrounding the center section, at least one LED chip arranged on the bottom of the central section, a bond wire leading from the LED chip to the bottom of the enlarged section in order to contact a first electrode of the LED chip. The bond wire is electrically connected to the back side of the platform by means of a through contact leading from the bottom of the enlarged section through the platform to the backside of the platform.

The LED module may furthermore comprise a through contact in the bottom of the center section contacting a second electrode of the LED chip.

The platform can be made e.g. from silicon.

A color conversion medium can be provided for filling the central section of the recession, wherein the top surface of the color conversion medium essentially can be flush with the bottom of the enlarged section of the recession.

The enlarged section of the recession can be filled with a transparent medium, which is preferably void of color conversion and/or scattering particles.

Alternatively the enlarged section of the recession can be filled with a transparent medium which comprises color conversion and/or scattering particles.

The color conversion particles in the enlarges section of the recession can be selected such that they convert light into a first spectrum different, whereas the color conversion particles in the central section convert light to a second spectrum different to the first spectrum.

The enlarged section can be filled with a glob-top extending above the top surface of the platform.

Alternatively the enlarged section can be filled with a medium which flushes the top surface of the platform.

The central section of the recession can present the cross-sectional shape of a square or rectangle.

The enlarged section can present the cross-sectional shape of a circle.

The bottom of the central section may present a thickness less than 300 μm, preferably between 50 and 150 μm.

The enlarged section can have a diameter of between 2 mm to 4 mm, preferably 2.0 mm to 3.0 mm.

The platform, in a top view, may present the cross-sectional shape of a square or rectangle.

The walls defining the enlarged section can be made e.g. integrally with the portion of the platform defining the central recession. In this case the enlarged section and the central section of the recession can be produced by a two-step etching process, e.g. an anisotropic etching process in silicon.

Alternatively, the walls defining the enlarged section can be mounted as a separate piece to the portion of the platform defining the central recession.

A layer on the bottom of the central recession can be provided in order to connect an electrode of the LED chip with the through contact.

The through contact in the bottom of the central section of the recession can be offset vis-a-vis the chip, i.e. outside the contours of the LED chip(s) when seen from above.

The bond wire may be electrically connected to the back side of the platform by means of a further through contact leading from the bottom of the enlarged section through the platform to the backside of the platform.

A further aspect of the invention relates to a silicon platform having a recession with a center section and an enlarged section, the silicon platform being designed for use in a LED module.

A still further aspect of the invention relates to a LED module in which one or more electrodes of the LED chip are contacted via lateral metallization paths, the LED module comprising:
- a platform having a recession,
- at least one LED chip arranged on the bottom of the recession,
- a first conducting path (metallization path) leading from a first electrode of the LED chip across the side wall of the recession to the to surface of the platform and from there across a lateral wall of the platform to the back side of the platform, and
- a second conducting path, electrically isolated from the first conducting path, leading from a second electrode of the LED chip across the side wall of the recession to the to surface of the platform and from there across a lateral wall of the platform to the back side of the platform.

BRIEF DESCRIPTION OF THE DRAWINGS

Further objects, features and advantages will become evident for the skilled person when reading the following description of a plurality of different embodiments of the present invention, when taken in conjunction with the figures of the enclosed drawings.

Figure 1:
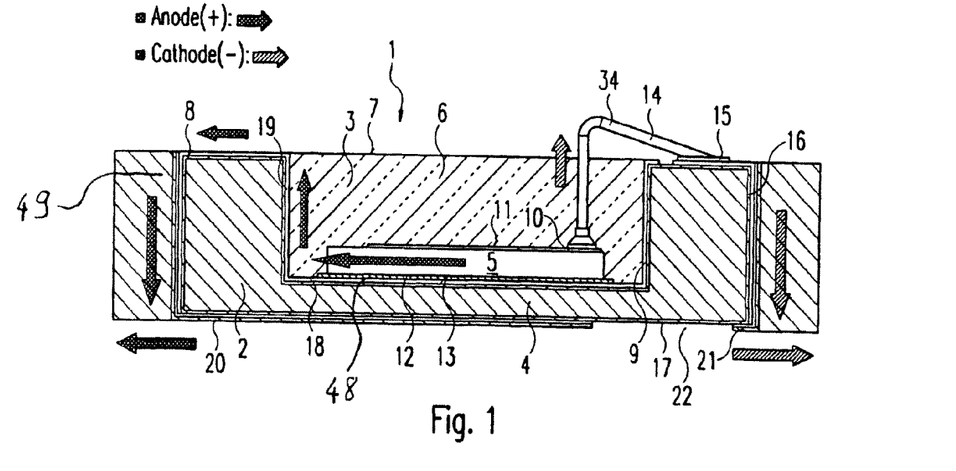
FIG. 1 shows a first embodiment of the present invention, in which a LED chip placed in a recess of a platform is electrically contacted via a lateral conducting path (metallization path) and a bond wire, respectively.
Figure 2:
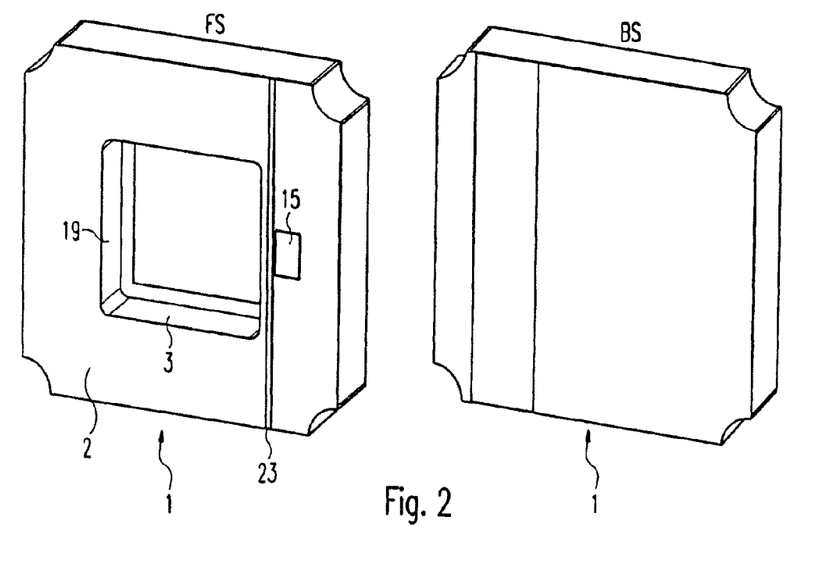
FIG. 2 shows a view of the front side (FS) and the back side (BS) of the LED module of FIG. 1, respectively.

FIGS. 1, 2:
Embodiment with Lateral Metallization Path(s) (Surface Current Paths):

DETAILED DESCRIPTION

With reference to FIGS. 1 and 2 an embodiment will be explained in which at least one and preferably even both electrodes of a LED chip arranged in a recession in a (e.g. silicon) platform are connected to electrical contacts at the backside of the platform via at least one lateral metallization path constituting a surface current path.

FIG. 1 generally shows a LED module 1 which is designed to produce light of defined spectrum. The LED module 1 comprises a platform which can be made e.g. from silicon (silicon wafer). The platform presents a recession 3 at the bottom 4 of which a LED chip 5 is placed which is able to emit light of a defined spectrum. The cavity defined by the recession 3 can be filled with a transparent medium 6 which may comprise color conversion particles and/or scattering particles.

In the embodiment shown in FIG. 1 the top surface 7 of the filling 6 in the recession 3 is made to essentially flush with the top surface 8 of the silicon platform.

The sidewalls 9, implying sidewall 19, of the recession 3 are shown to be vertical in FIG. 1, but can also be inclined such that the recession 3 opens towards the top frame seen in FIG. 1.

The sidewalls 9 can be made to be reflective (by surface treating and/or metal coating such as e.g. Al or Ag) if desired.

In order to contact a first electrode 10 at the top surface 11 of the LED chip and a second electrode 12 provided at the bottom face of the LED chip 5 different approaches can be taken. In the embodiment shown in FIG. 1 the electrode 10 at the top face 11 of the LED chip 5 is contacted via a bond wire 14, which can be made e.g. from gold and which leads, extending above the top face 7 of the filling 6 of the recession 3 to a landing pad 15 arranged on the top face 8 of the platform 2. The electrically conducting path then leads from the landing pad 15 across a sidewall 16 of the platform 2 to the backside (rear side) 17 of the platform 2.

The electrode 12 arranged at the bottom face 13 of the LED chip 5 is contacted via a electrically conducting metallization layer 48, which can be a plate, with electrically conducting metallization path 18 which leads from the bottom 4 of the platform 2 across a sidewall 19 of the cavity (recession) 3 to the top surface 8 of the platform 2 and then across a sidewall 49 (different to the sidewall 16 of the first mentioned electrode) to an electrical contact 20 arranged at the backside (rear side) of the silicon platform 2. The electrical contacts 20, 21 are separated from each other via an isolation gap 22. The electrically conducting path 18 and layer 48 can be made of each material which is electrically conducting, e.g. also semimetals.

It is to be noted that also instead of using a bond wire contact 14 for the first electrode 10 on the top face 11 of the LED chip 5, another metallization path similar from the metallization path 18, but electrically isolated thereof, can be used.

In order to protect the bond wire 14 mechanically, a second transparent layer (not shown in FIG. 1) is usually applied on top of the LED module 1 such that it encapsulates the bond wire 14.

In the embodiment of FIG. 1 the silicon platform 2 is void of through holes. FIG. 2 shows a view of the front side (FS) and the rear side (backside (BS)) of the module 1 of the embodiment of FIG. 1.

As can be seen, the recession 3 may have an essentially rectangular or square cross-sectional shape. Also the outer contours of the silicon platform may be square or rectangular. The front side illustrates the landing pad 15 for the bond wire 14 (which is not illustrated in FIG. 2). The electrically conducting metallization layer 48 and the sidewall 19 with the electrically conducting path 18 are also schematically shown in FIG. 2 (front side).

The landing pad 15 for the bond wire 14 may be isolated from the metallization path 18 by an isolating layer 23 which may be formed e.g. by silicon oxide.

FIGS. 3 to 9:
Embodiments with Through Hole(s) in the Platform:

With reference to FIGS. 3 to 9 now embodiments will be explained in which the electrical contacts of the LED chip arranged in a recession of a (e.g. silicon) platform are connected to electrical contacts at the rear side of the platform via through holes traversing the platform. Each through hole may be connected to the associated electrode of the LED chip via a metallization path or a bond wire. The through holes may be provided in the central section and/or the enlarged section of the recess in the platform, which gives a degree-of-freedom to the design options.

Through holes, also called vias, are a frequently used technology in semiconductor manufacturing, i.e. in integrated circuit design and also in the field of LED-platforms. (A through-silicon via is a vertical electrical connection (via) passing completely through a substrate or wafer). A through hole is a small opening in a substrate-layer, e.g. an insulating oxide layer that allows a conductive connection between different layers. The holes are made electrically conductive, e.g. by electroplating, or by filling them with annular rings or small rivets. In this way through holes are significantly different to lateral metallization path(s) (surface current paths) as shown in FIGS. 1 and 2. They are also significantly different to lateral metallization path(s) (surface current paths) which are embedded in a platform, e.g. by applying a flow molding technology. Here the electrically conductive path is namely established first and then the covering material forming the platform is superimposed.

Note that the embodiments according to FIGS. 3, 4, 5 and 7, 8, 9 relate to vertical type chips. A vertical type chip has two electrodes on either side of chip. Therefore at least one wire bond is connecting the top surface cathode, while the anode on the chip bottom is connected via e.g. a gold pad in the etched recession.

As will be explained in great detail further below, the embodiments of FIGS. 3, 4, 5 relate to designs in which the anode contacting through-hole is in the recession, while the embodiments of FIGS. 7, 8, 9 describe the case that through-holes for both electrodes of the LED chip traverse the platform outside the recession and thus in a thicker portion of the platform (in comparison to the reduced thickness of the bottom of the recession of the platform).

Figure 3:
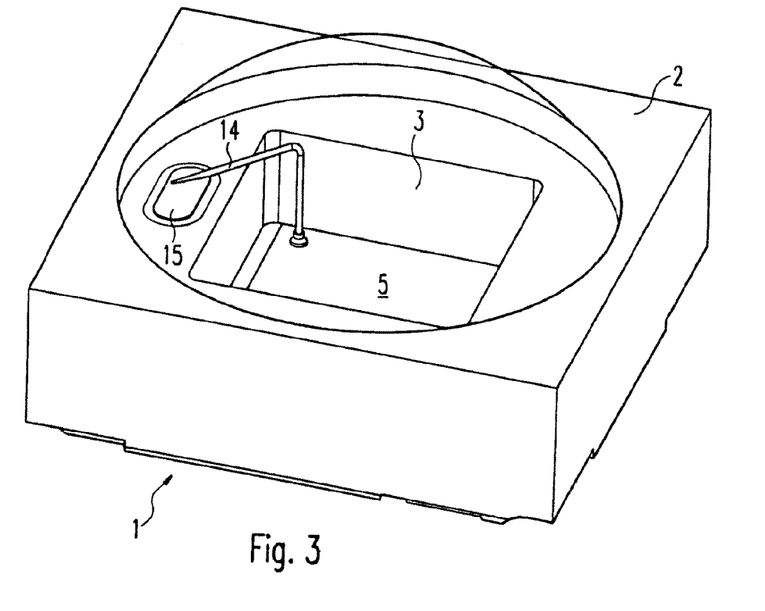
FIG. 3 shows a perspective view of a further embodiment of the present invention having a vertical-type LED chip (one electrode being at a top face of the LED chip and the other electrode being at the bottom surface thereof)

With reference to FIG. 3 now a second embodiment of the present invention will be explained. A vertical-type LED module 1 having a silicon platform 2 and a LED chip 5 arranged in a recession 3 is provided. As can be seen in FIGS. 3 and 4, this recession 3 comprises a first central section 25 at the bottom 4 of which the LED chip 5 is arranged.

Additionally, a second enlarged section 26 is arranged above the central section 25.

The first central section 25 and the second enlarged section 26 of the recession 3 can be produced e.g. by a two-step (anisotropic) etching process.

The first electrode 10 at the top surface of the LED chip 5 is led via a bond wire 14 beyond the central section 25 and on a landing pad 15 arranged on a bottom face 27 of the second enlarged section 26 of the recession 3. In order to connect the landing pad 15 of the bond wire 14 with the rear side of the platform 2, in this embodiment at least one through contact 28, which is can be metalized, is led across the (e.g. silicon) platform 2 to the rear side contact 20.

This through contact as well as all other through contacts mentioned in the framework of the invention can be made e.g. by a high aspect ratio DRIE (deep-reactive ion etching).

The electrode 12 of the LED chip 5 arranged at the bottom face 13 of the LED chip 5 is again contacted via a layer 48. However, in the embodiment of FIGS. 3 and 4 this metallization layer 48 is also in contact with a second through contact 29 arranged in the bottom 4 of the silicon platform 2. The second through hole 29 is offset in the sense that it is arranged outside the contours of the LED chip 15 (when seen in a top view). The second through contact 29 leads again to rear side contacts 21.

By having the second through contact 29 outside the contours of the LED chip 5 and offset to the metallization layer 48, problems can be avoided which might occur by the through contact 29 making the metallization plane 48 for the LED chip uneven and thus hindering a proper soldering of the LED chip 5 to the bottom 4 via the metallization layer 48.

Figure 4:
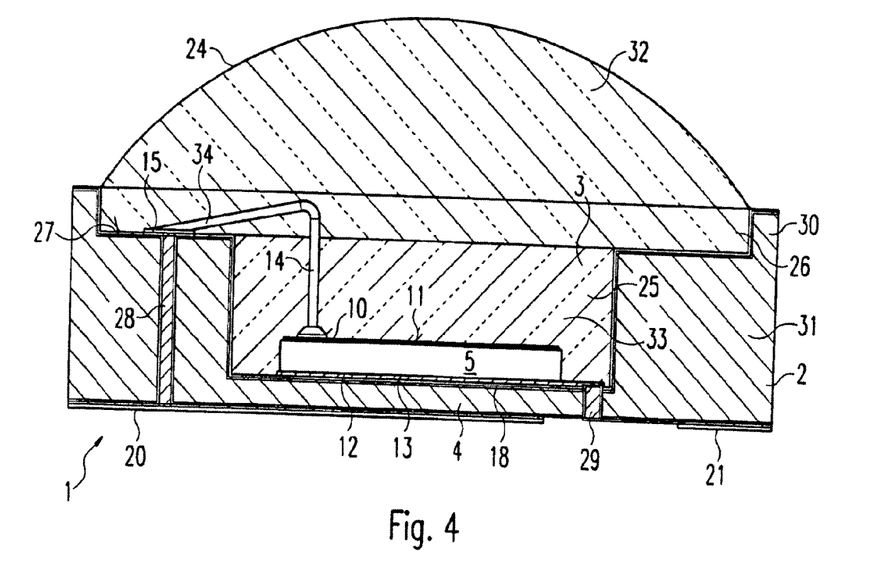
FIG. 4 shows a cross-sectional side view of the embodiment of FIG. 3.

In the embodiment of FIGS. 3 and 4 it is indicated that the walls 30 defining the second enlarged section of the recession 3 may be made integrally with the part 31 of the platform 2, which part 31 defines the first central section 25 of the recession 3 and also comprises the bottom 4 of the platform 2.

However, it is to be noted that the part of the silicon platform 2 comprising the walls 30 of the second enlarged section 26 of the recess 3 may also be mounted as a separate piece (e.g. ring) on the part 31.

As can be seen particularly from FIG. 1, the central section 25 of the recession 3 may have a rectangular or square shape.

The second enlarged section 26 may have a circular or ellipsoid shape.

The first central section 25 of the recession 3 may be filled with a color conversion medium, i.e. a matrix such as a resin having dispersed therein color conversion particles.

Preferably, the material used for filling the second enlarged section 26 of the recession 3 is transparent, but does not comprise color conversion particles.

In the embodiment of FIG. 4 the filling for the second enlarged section 26 is actually a so-called glob-top 24 which is dispensed using the sidewalls 30 of the second enlarged section 26 of the recession 3 as a dam.

Figure 5:
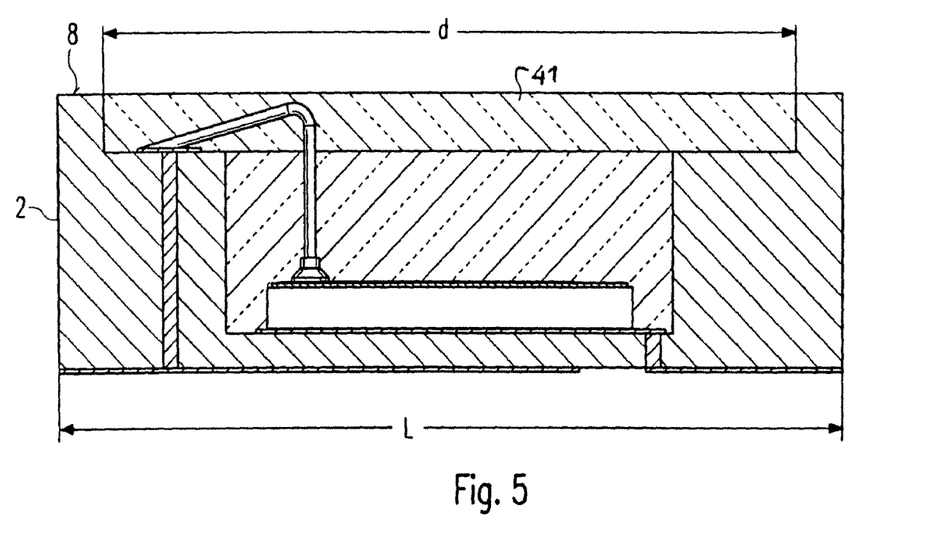
FIG. 5 shows a further embodiment of the present invention in which the LED chip in the recession of the platform is contacted via a bond wire at the top surface and a through hole, respectively.

In the embodiment of FIG. 5 the essential difference is that the material 41 used for filling the second, enlarged section 26 of the recession 3 is made to be flush with the top surface 8 of the silicon platform 2.

As can be seen from FIGS. 3, 4 and 5, preferably the filling of the first central section 25 of the recess 3 is made such that the material 33 used for this filling flushes with the bottom 27 of the second enlarged section 26 of the recession 3.

In any case, according to the embodiments of FIGS. 1-6, the bond wire 14 will always go through the first material 33 preferably comprising color conversion particles, wherein the bent portion 34 of the bond wire 14, leading to the landing pad 15, is protected by a separately applied second transparent matrix.

Figure 6:
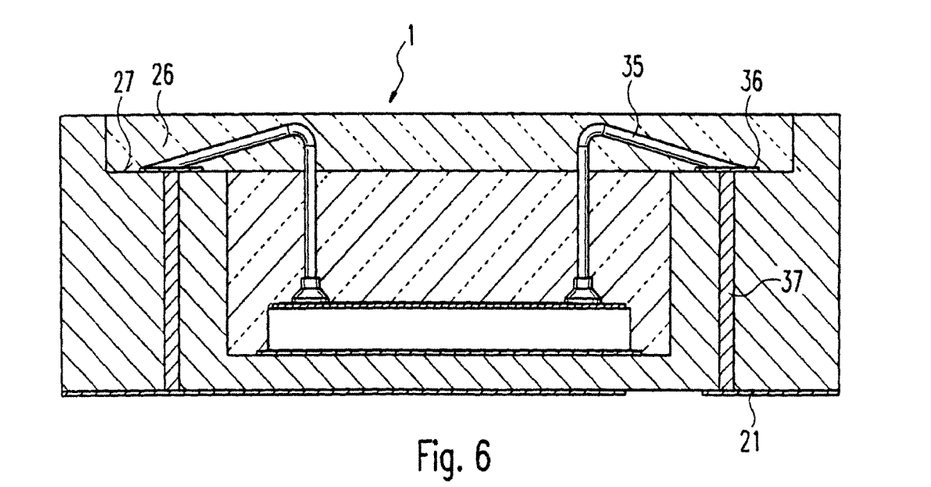
FIG. 6 shows a still further embodiment of the present invention in which a FU (face up) mounted LED chip in the recession of the platform is contacted via two bond wires

The embodiment shown in FIG. 6 is particularly suited for FU (face up) chip packaging. A FU mounted chip has both the anode and the cathode on top of the LED chip, such that there are at least two wire bonds connecting the chip top surface, for anode and cathode respectively.

Therefore, in the embodiment of FIG. 6, instead of having the through-hole 29, also the second electrode of the LED chip 5 is electrically contacted via a second bond wire 35 which leads to a second landing pad 36 also arranged at the bottom 27 of the second enlarged section 26 of the recession 3. This second landing pad 36 is electrically connected to the rear side contacts 21 of the LED module 1 in the embodiment of FIG. 6 via a second through contact 37. Both through contacts shown in FIG. 5 are comparable and have the same length. Moving both through holes (through contacts) outside the central section of the recession minimizes the spatial constraints and allows the production of more compact LED modules.

Figure 7:
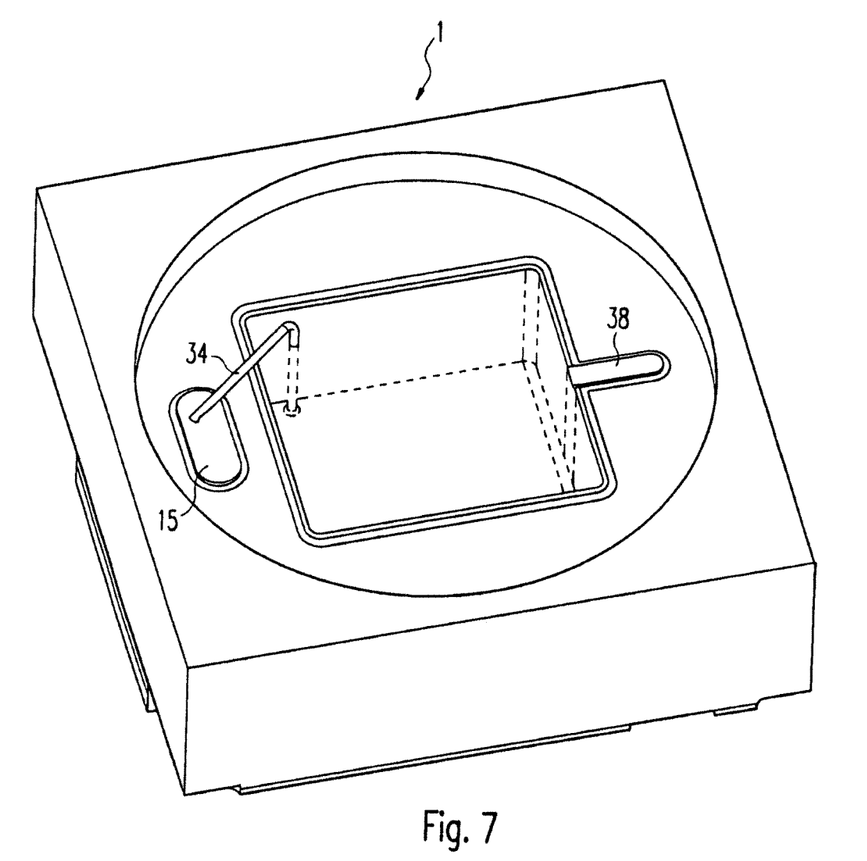
FIG. 7 shows an embodiment in which the electrodes of a vertical-type LED chip are contacted by a metallization path and a bond wire, respectively.
Figure 8:
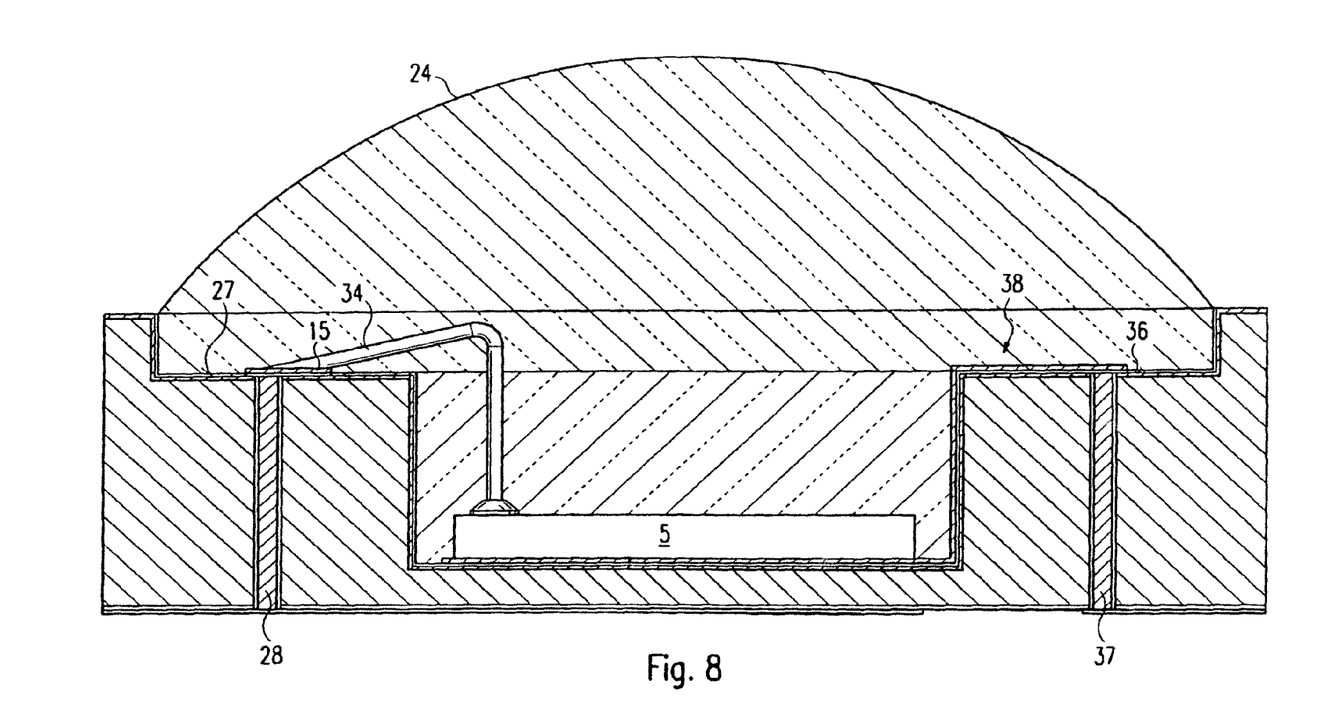
FIG. 8 shows a cross-sectional view of the embodiment of FIG. 7.
Figure 9:
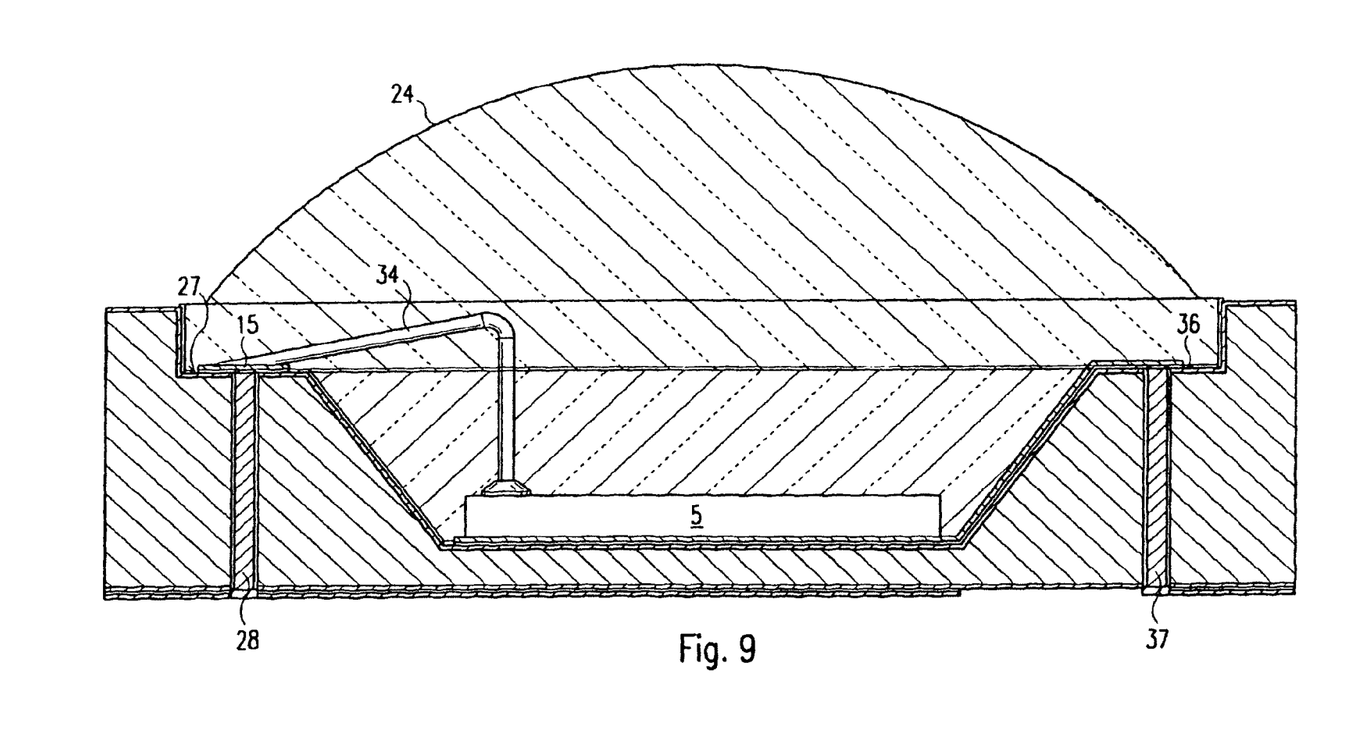
FIG. 9 shows a modification of the embodiment of FIGS. 7 and 8.

With reference to FIGS. 7 to 9 a further embodiment of the invention will now be explained, in which two through holes are connecting the bottom of the enlarged section of the recess with the rear side of the platform, wherein one of the through holes is connected to an electrode of the LED chip via a bond wire and the other one using a metallization path across the bottom and a side wall of the central section of the recession. Moving both through holes (through contacts) outside the central section of the recession minimizes the spatial constraints and allows the production of more compact LED modules.

Preferably, the enlarged section 26 of the recession 3 in the embodiments of FIGS. 3 to 6 (which has the cross-sectional shape of a circle) has a diameter of between 2 mm to 4 mm, preferably 2.0 mm to 3.0 mm.

Preferably the bottom 4 of the central section 25 has a thickness less than 300 µm, preferably between 50 µm and 150 µm.

As shown in FIGS. 7 and 8, in this embodiment there is the difference to the embodiment to FIG. 6 that a metallization path 38 connecting the anode of the LED chip 5 replaces the bond wire 35 of FIG. 5.

According to the modification shown in FIG. 9 the side walls of the central section are inclined (contrary to the vertical walls of the embodiment shown in FIGS. 7 and 8) and can be produced e.g. by liquid phase etching. The metallization path is applied across the inclined walls of the central section of the recess.

REFERENCE LIST

1 LED module
2 platform
3 recession
4 bottom of recession
5 LED-chip
6 filling
7 top face of LED-chip
8 top surface
9 sidewalls of recession
10 first electrode
11 top surface of LED-chip
14 bond wire
15 landing pad
16 sidewall of platform
17 backside of platform
19 sidewall of recession
20 electrical contact 1
21 electrical contact 2
22 isolation gap
23 isolation layer
25 center section of recession
26 step-wise enlarged section
27 bottom of second enlarged section
28 first through contact
29 second through contact
30 walls defining the enlarged section
31 portion of the platform
32 lens
33 filler for first section 25
34 bent portion
35 bond wire
36 second landing pad
37 second through contact
38 metallization path
41 filler for second enlarged section 26
48 electrically conducting layer
49 sidewall of platform

The invention claimed is:

1. An LED module, comprising:
   a platform having a recess, the recess having a central section with a bottom and a step-wise enlarged section surrounding the central section,
   at least one LED chip arranged on a bottom of the central section,
   a bond wire leading from the LED chip to a bottom of the enlarged section to contact a first electrode of the LED chip, wherein the bond wire is electrically connected to a back side of the platform by a first through contact leading from the bottom of the enlarged section through the platform to the back side of the platform, and
   a second through contact in the bottom of the central section contacting a second electrode of the LED chip, wherein the second through contact is arranged outside the contours of the LED chip when seen in a top view,
   wherein each of the first and second through contacts is a vertical electrical connection passing through the platform and wherein the second through contact electrically connects the LED chip through the platform to a rear side contact at the bottom of the platform.

2. The LED module according to claim 1, wherein a color conversion medium fills the central section of the recess, and wherein a top surface of the color conversion medium is essentially flush with the bottom of the enlarged section of the recess.

3. The LED module according to claim 1, wherein the enlarged section of the recess is filled with a transparent medium.

4. The LED module according to claim 1, wherein first color conversion particles provided in the enlarged section of the recess are selected such that they convert light into a first spectrum different to the spectrum emitted by the LED chip, whereas second color conversion particles in the central section convert light to a second spectrum different from the first spectrum and different from the LED chip spectrum.

5. The LED module according to claim 1, wherein the central section of the recess is filled with a transparent medium void of color conversion particles, and the enlarged section is filled with a medium comprising color conversion particles.

6. The LED module according to claim 1, wherein the enlarged section is filled with a glob-top extending above the top surface of the platform.

7. The LED module according to claim 1, wherein the enlarged section is filled with a medium that is essentially flush with a top surface of the platform.

8. The LED module according to claim 1, wherein the central section of the recess has a cross-sectional shape of a square or rectangle, and is less than 300 µm thick.

9. The LED module according to claim 1, wherein the enlarged section has a cross-sectional shape of a circle.

10. The LED module according to claim 9, wherein the enlarged section has a diameter of between 2 mm to 4 mm.

11. The LED module according to claim 1, wherein the walls defining the enlarged section are integral with the portion of the platform defining the central recess and comprising the bottom.

12. The LED module according to claim 11, wherein the enlarged section and the central section of the recess are produced by a two-step etching process.

13. The LED module according to claim 1, wherein the walls defining the enlarged section are attached as a separate piece to the portion of the platform defining the central recess.

14. The LED module according to claim 1, wherein a metallization layer on the bottom of the central section of the recess connects an electrode of the LED chip with the second through contact.

15. The LED module according to claim 1, wherein the second through contact in the bottom of the central section of the recession recess is outside the contours of the LED chip when seen from above.

16. A silicon platform having a recess with a central section and an enlarged section, the silicon platform being designed for use in a LED module according to claim 1.

17. A LED module, comprising:
a platform having a recess,
at least one LED chip arranged on a bottom of the recess,
a first conducting path leading from a first electrode of the LED chip across and on a side wall of the recess to a topmost surface of the platform and from there across a lateral wall of the platform to a back side of the platform, and
a second conducting path, electrically isolated from the first conducting path, leading from a second electrode of the LED chip across the side wall of the recess to the top surface of the platform and from there across a lateral wall of the platform to the back side of the platform,
wherein at least one of the first and second conducting paths is a surface current path.

18. The LED module according to claim 1, wherein the platform is made from silicon.

19. The LED module according to claim 1, wherein the platform, in a top view, has a cross-sectional shape of a square or rectangle.

20. The LED module of claim 3, wherein the transparent medium is void of color conversion and/or scattering particles.

21. The LED module according to claim 8, wherein the central section is between 50 μm and 150 μm thick.

22. The LED module according to claim 9, wherein the enlarged section has a diameter of 2.0 mm to 3.0 mm.

23. The LED module according to claim 17, wherein the platform is made from silicon.

24. The LED module according to claim 18, wherein the platform, in a top view, has a cross-sectional shape of a square or rectangle.

* * * * *